(12) United States Patent
Iacob

(10) Patent No.: US 7,123,170 B1
(45) Date of Patent: Oct. 17, 2006

(54) SYSTEM AND METHOD FOR A DATA-INPUT ARRAY CAPABLE OF BEING SCANNED USING A REDUCED NUMBER OF SIGNALS

(75) Inventor: Alin Theodor Iacob, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 347 days.

(21) Appl. No.: 10/649,173

(22) Filed: Aug. 26, 2003

(51) Int. Cl.
*H03M 11/00* (2006.01)
(52) U.S. Cl. .................... 341/26; 341/20; 345/168
(58) Field of Classification Search .............. 341/26, 341/20, 22; 345/168
See application file for complete search history.

(56) References Cited

U.S. PATENT DOCUMENTS

| | | | |
|---|---|---|---|
| 4,277,780 A | | 7/1981 | Sonderman et al. |
| 4,583,092 A | * | 4/1986 | Saito ........................... 341/26 |
| 4,906,993 A | * | 3/1990 | Freeman et al. .............. 341/26 |
| 5,856,794 A | | 1/1999 | Chang |

\* cited by examiner

*Primary Examiner*—Albert K. Wong (57) ABSTRACT

A system and method for scanning a data-input array (e.g., a keyboard or keypad) using a reduced number of signals is disclosed. Specifically, a switch array is disclosed comprising a plurality of switches and a plurality of input/output (I/O) lines. The switch array is arranged in an N*N matrix. A plurality of N I/O lines is used to scan the matrix. In one embodiment, the switches in the array are arranged in an N*(N−1)/2 configuration. In this configuration, there is no duplication of circuit paths. In another embodiment, the switches in the array are arranged in an N(N−1) configuration. In this configuration, a plurality of diodes are used to identify an activated switch depending upon which of a plurality of signal paths is activated. The plurality of diodes is included to differentiate between pairs of switches that complete the same paths between pairs of I/O lines.

26 Claims, 7 Drawing Sheets

SYSTEM AND METHOD FOR A DATA-INPUT ARRAY CAPABLE OF BEING SCANNED USING A REDUCED NUMBER OF SIGNALS

BACKGROUND OF THE INVENTION

1. Field of the Invention

Embodiments of the present invention relate to the field of switch arrays. More particularly, embodiments of the present invention relate generally to scanning a key matrix using a reduced number of digital signals.

2. Related Art

Electronic devices require input mechanisms as an interface to provide a means for a user to interact with the electronic devices. These input mechanisms are arranged in a matrix configuration for efficiency when using a controller to scan the matrix to determine which input mechanisms are activated. To match a trend towards reducing the overall size and cost of the electronic devices, an emphasis is placed on reducing the size of the input mechanisms, the chip that contains the system controller, and the wiring that couples the matrix of input elements and the system controller.

Figure 1:
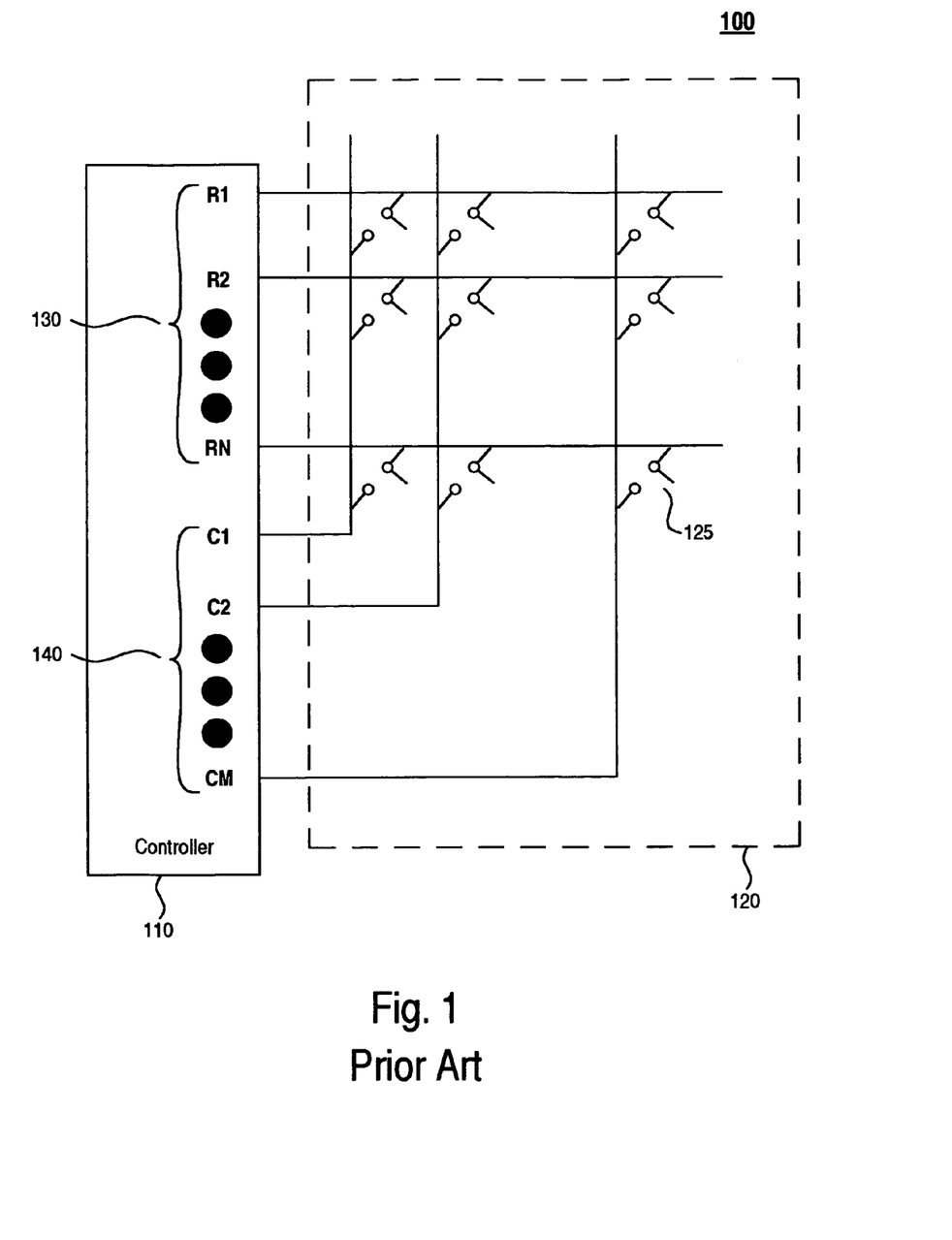
FIG. 1 is a schematic diagram of a key matrix arranged in an N*M matrix that requires N+M input and output lines combined to scan the matrix. In the particular case of N=M, the number of keys is maximized.

Prior Art FIG. 1 is a schematic diagram of a system 100 that is capable of scanning a key matrix 120 to determine which of the keys in the key matrix are activated. The system 100 monitors the flow of signals to determine the activation of the keys in the key matrix 120.

The system 100 comprises a controller chip 110 coupled to a key matrix 120 via a plurality of output lines 130 and a plurality of input lines 140. The plurality of output lines 130 can be considered as rows servicing the key matrix 120. The plurality of output lines comprise row R1, R2, up to the $n^{th}$ row RN. The plurality of input lines 140 can be considered as columns servicing the key matrix 120. As such, the plurality of input lines comprise column C1, C2, up to the $m^{th}$ column CM.

The key matrix 120 comprises a plurality of switching elements (e.g. switching element 125). Each of the plurality of switching elements uniquely couples one of the plurality of output lines 130 to one of the plurality of input lines 140. As such, a switching element is identified by its associated row output line and its associated column input line. More particularly, between any of the rows and any of the columns, only one switching element is present.

In order to scan the key matrix 120, the controller chip 110 sequentially sends signals one at a time across each of the plurality of rows 130 and monitors the plurality of columns to determine if the signal returns via a circuit path completed when a corresponding switching element is activated. Depending on which of the rows a signal is sent, and which of the columns the signal is detected, the associated switching element that was activated can be determined. That is a switching element can be determined from its association with a particular row and column.

In the system 100 of Prior Art FIG. 1, the controller 110 requires N+M connections to service the key matrix 120. For example, a typical keyboard for a computer system currently sold on the market has approximately 104 keys in the key matrix 120 that are electrically coupled in a 16*9 matrix. In a better implementation of the same keyboard, an 11*10 matrix would be sufficient. In these cases, the controller chip 110 would require 25 pins (16+9) or 21 pins (11+10) in order to scan all the keys.

The system 100 of the Prior Art FIG. 1 has several manufacturing disadvantages. The system 100 requires N+M connections to service an N*M matrix. As chips become smaller and more powerful, additional pins add to the cost and complexity of manufacturing. As such, what is required is a system and method for reducing the number of pins in the controller chip 100 to scan the key matrix 120 to reduce the manufacturing costs. In addition, electronic devices can include the controller chip 110 on a separate board from the key matrix (e.g., an input panel separate from the controller chip on a video recorder) coupled together via ribbon cabling. As such, what is required is a system and method for reducing the number of wires servicing the key matrix to reduce the manufacturing costs. Also, as integrated circuit (IC) manufacturers increase the performance of IC chips, more functionality can be provided by the IC chip as accessed through the pins on the IC chip. What is required is a system and method for increasing the number of services provided by the IC chip (e.g., the number of keys in the key matrix) without increasing the number of pins on the IC chip, to reduce the manufacturing costs.

SUMMARY OF THE INVENTION

Accordingly, various embodiments of the present invention disclose a system and method for a key matrix that can be scanned using a reduced number of signals. As a result, the present invention is capable of reducing the number of pins on a system controller used to scan a key matrix, to reduce manufacturing costs. In addition, the present invention is capable of reducing the number of wires used to transmit signals between a system controller and a key matrix, thereby reducing the size and cost of cabling and ultimately reducing the manufacturing costs. Also, the present invention is capable of increasing the functionality and number of services provided by an integrated circuit (IC) chip, without increasing the number of pins on the IC chip by reassigning the saved pins to new functions.

In the prior art, in a legacy key-scanning system that uses a number of N output signals and a same number of N input signals, the maximum number of keys supported is N*N. The number of required scanning signals is, in this case, 2*N. In legacy systems, the signals are divided in two groups, with one group being always in output mode and the second group being always in input mode.

Two new scanning systems are disclosed. Both key-scanning systems disclosed include the innovative method that all the scanning signals can be dynamically configured as input or output lines (I/O).

System #1

Specifically, in one embodiment, is disclosed a key-scanning system that is capable of almost doubling the number of keys that can be scanned with the same number of scanning signals, as compared to legacy key-scanning systems. The system does not require any external components outside the key-scan controller chip. The system uses the same number of scanning 2*N signals but reorganized in a 2N*2N matrix that allows a maximum number of keys that occupy the upper diagonal section of the matrix, without the diagonal line. The maximum number of keys is (2N)*(2N)/2−2N, that is, 2N*N−2N=2N*(N−1) keys. For higher values, the maximum number of keys is almost double compared with legacy systems, which support N*N keys. Alternately, if the same number of keys as in a legacy key-scan system needs to be scanned, the required number of scanning signals can be reduced.

System #2

In a second embodiment, is disclosed a key-scanning system that is capable of almost quadrupling the number of keys that can be scanned with the same number of scanning signals, as compared to legacy key-scanning systems. The system requires a number of external components, for example diodes, outside the key-scan controller chip. The system uses the same number of scanning 2*N signals but reorganized in a 2N*2N matrix that allows a maximum number of keys that occupy the entire matrix, without the diagonal line. The maximum number of keys is (2N)*(2N)–2N, that is 4N*N–2N keys. For higher N values, the maximum number of keys is almost 4 times larger as compared with legacy systems, which support N*N keys. Alternately, if the same number of keys as in a legacy key-scan systems needs to be scanned, the required number of scanning signals can be further reduced.

In both systems disclosed, a plurality of input/output (I/O) lines are coupled to a number of keys to create a plurality of signal paths, each of which coupled two of the I/O lines through an associated key. As such, an activated key is identified depending upon which of the plurality of signal paths is completed through the activated key. In addition, in the second embodiment, a plurality of diodes is arranged to differentiated between pair of switches that complete equivalent circuit paths between pairs of I/O lines when scanning the matrix, thus allowing doubling the number of keys as compared with the system disclosed in the first embodiment.

Method

For both systems made known above, a method is disclosed for scanning a key matrix using a reduced number of signals. The method begins by sending a logic high output signal over a first I/O line of a plurality of I/O lines that are coupled to a key array. The key array comprises a number of switches arranged in a matrix. The plurality of I/O lines is coupled to the key array to create a plurality of unique signal paths. Each of the signal paths uniquely couple two of the I/O lines through an associated switch.

The method continues by reading the logic high signal over a second I/O line. This is accomplished by monitoring the plurality of I/O lines and determining which of the I/O lines are pulled to logic high. The method understands which of the I/O lines is operating in an output mode, and as such, understands that the other I/O line is operating in an input mode.

Thereafter, the method continues by isolating an activated key by determining which of the plurality of unique signal paths couples the first I/O line to the second I/O line through the activated key. That is, when a key is activated, a circuit path is completed between a unique pair of I/O lines. The method understands that one of the unique pair of I/O lines is operating in the output mode, and the other is operating in the input mode. By identifying the unique pair of I/O lines and understanding which of the I/O lines is operating in an output mode, the associated key that is activated can be determined.

BRIEF DESCRIPTION OF THE DRAWINGS

Prior Art

DETAILED DESCRIPTION OF THE INVENTION

Reference will now be made in detail to the preferred embodiments of the present invention, a system and method for a switch array that is capable of being scanned using a reduced number of signals, examples of which are illustrated in the accompanying drawings.

Accordingly, various embodiments of the present invention disclose a system and method for a switch array that can be scanned using a reduced number of signals. As an advantage over the prior art, the present invention is capable of reducing the number of pins on a system controller used to scan a key matrix, to reduce manufacturing costs. As a further advantage, the present invention is capable of reducing the number of wires used to transmit signals between a system controller and a key matrix, thereby reducing the size and cost of cabling and ultimately reducing the manufacturing costs. Moreover, the present invention is capable of increasing the functionality and number of services provided by an integrated circuit (IC) chip, without increasing the number of pins on the IC chip by reassigning the saved pins to new functions.

Embodiments of the present invention can be implemented on hardware an/or software running on an electronic system. The electronic system can be a computer system, an embedded system, a personal computer, notebook computer, server computer, mainframe, networked computer, handheld computer, personal digital assistant, digital video disk (DVD) player, workstation, cell phones, remote controls, and the like. In software, this software program is operable for scanning a key matrix using a reduced number of digital signals. In one embodiment, the computer system includes a processor coupled to a bus and memory storage coupled to the bus. The memory storage can be volatile or non-volatile and can include removable storage media. The computer can also include a display, provision for data input and output, etc.

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "sending," "reading," "monitoring," "isolating," "receiving," or the like, refer to the action and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Figure 2:
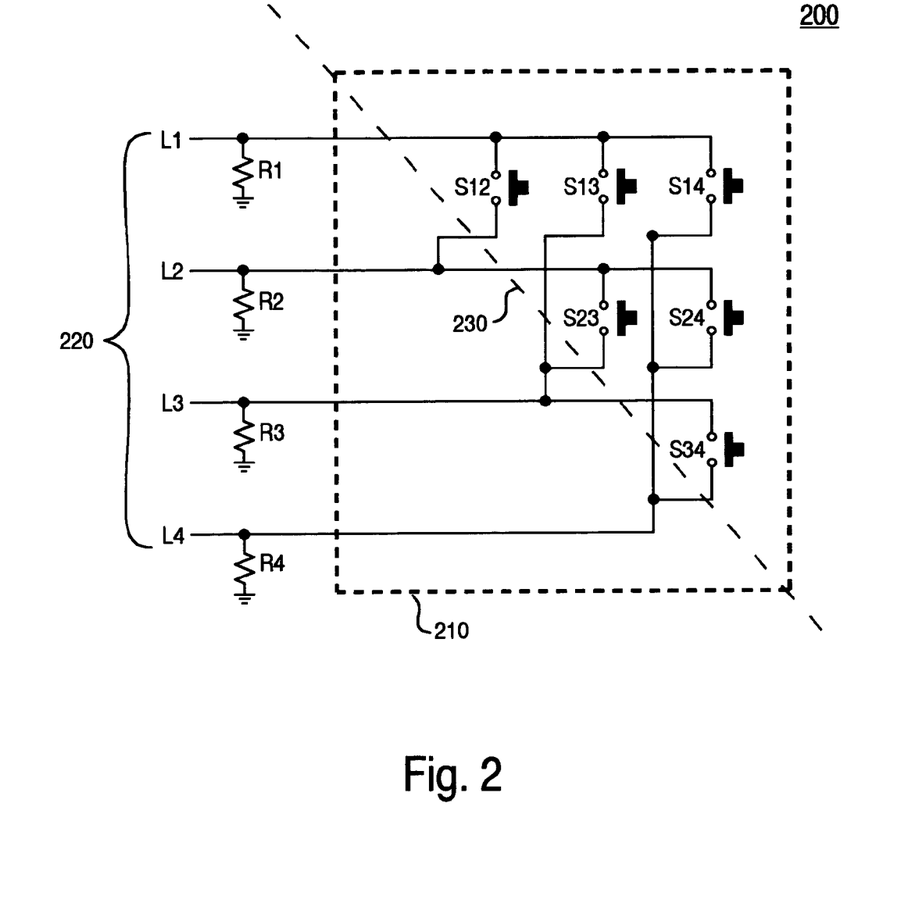
FIG. 2 is a schematic diagram of a N*N switch array comprising N*(N–1)/2 switches that is capable of being scanned with N input/output (I/O) lines, in accordance with one embodiment of the present invention.

FIG. 2 is an exemplary schematic diagram illustrating a cross scheme 200 that is capable of scanning a switch array 210 with a reduced number of signals, in accordance with one embodiment of the present invention. Specifically, the cross scheme 200 comprises a switch array 210, a plurality of input/output (I/O) lines 220 (L1, L2, L3, and L4 of FIG. 2), and a plurality of pull down resistors (R1, R2, R3, and R4 of FIG. 2). In the embodiment of FIG. 2, the cross scheme 200 does not implement diodes to distinguish between multiple signal paths. That is, in the cross scheme 200 an activated switch is associated with only one pair of I/O lines. As such, when a signal is detected on a pair of I/O lines, only one associated switch is activated.

The diagram in FIG. 2 is an example of a 4*4 switch array that is read by a scanning circuit (not shown) that is coupled to the I/O lines 220. The 4*4 switch array is defined by rows and columns. A diagonal line 230 designates a location in the switch array 210 where the row number matches the column number (e.g., row 1, column 1; row 2, column 2; etc.). Switches located along diagonal line 230 are not available. In addition, switches located below diagonal line 230 are also not available.

Although the present embodiment is described illustrating a 4*4 switch array 210 accessed through four I/O lines 220, other embodiments of the present invention are well suited to supporting an N*N switch array accessed through N I/O lines. Still other embodiments may comprise a subset of the N*N array of switches.

In general, the maximum number of switches in an N*N switch array that is supported by a system similar to system 200 is (½)*N*(N−1). This is due to the fact that only the switches that are above the diagonal line can be uniquely identified by the controller. The explanation is that N*N is the maximum number of switches, from which the diagonal line of N switches are subtracted. The result is divided by 2 in order to keep only the switches above the diagonal. That is, (N*N−N)/2=N*(N−1)/2=(½)*N*(N−1). Thus, the switch array comprises a maximum of (½)*N*(N−1) switches arranged in a matrix that is scanned using N I/O lines. For example, in system 200, the maximum number of switches supported in the 4*4 switch array 210 is 6. In exemplary system 200, the (½)N(N−1) switches (using a switch, row, column notation) are as follows: S12, S13, S14, S23, S24, and S34.

The switch array is serviced or accessed and coupled to a plurality of N I/O lines. The plurality of N I/O lines are used for transferring digital signals into and out of the switch array 210. The digital signals are used to scan the switch array 210 to determine which of the plurality of switches is activated.

More particularly, N I/O lines access the switch array 210 such that the plurality of N I/O lines are coupled to the maximum of (½)N(N−1) switches to create a plurality of circuit paths. In system 200, the N I/O lines comprise 4 I/O lines, as follows: L1, L2, L3, and L4 of FIG. 2. The circuit paths are completed by activating an associated switch.

As such, each of the circuit paths uniquely couple two of the plurality of N I/O lines through an associated switch or input element. That is, depending on which of the I/O lines complete a circuit path, an associated switch can be uniquely determined. For example, S12 uniquely couples L1 and L2; S13 uniquely couples L1 and L3; S14 uniquely couples L1 and L4; S23 uniquely couples L2 and L3; S24 uniquely couples L2 and L4; and S34 uniquely couples L3 and L4.

The pull down resistors in system 200 are used to pull the voltage to a logic level low in each of the I/O lines. In one embodiment, the pull down resistors in system 200 are passive resistors (e.g., a real physical component). In another embodiment, the pull down resistors in system 200 are active resistors. The active resistors are controlled by a scanning circuit, and can be integrated inside the scanning circuit, in another embodiment. As such, the active resistor can be a resistor that is turned on or off by the scanning circuit in order to reduce the power consumption. In that way, the I/O line that is driven high does not have a resistor load on itself while that pin is in a driving mode.

The scanning procedure implemented to discover whether one of the switches in the switch array 210 is engaged begins by applying a positive voltage pulse on each of the plurality of I/O lines 220 in a sequential manner. The lines that do not have a positive voltage pulse applied are in input mode and are pulled down by associated pulldown resistors, marked R1, 22, R3, and R4 of FIG. 2.

If one of the switches is activated, the positive voltage that is applied is read one of the other lines that is not the source. For example, when the source line is the L1 I/O line, the remaining I/O lines (L2, L3, and L4) are pulled down, and ready to complete a circuit path through an activated switch. As such, if the switch S13 was activated, then the logic high input signal over the L1 I/O line would complete a path through S13 to the L3 I/O line.

Figure 3A:
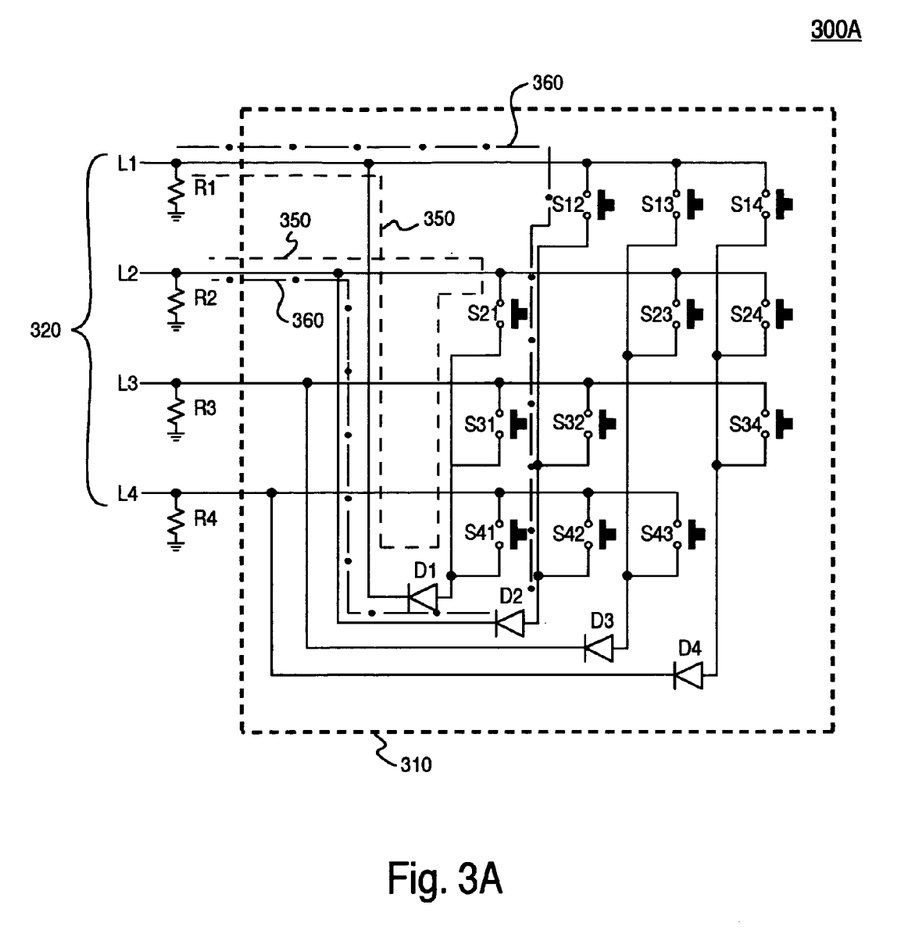
FIG. 3A is schematic diagram of a N*N switch array comprising N*(N–1) switches that is capable of being scanned with N I/O lines using a diode implementation, in accordance with one embodiment of the present invention.

Referring now to FIG. 3A, an exemplary schematic diagram is disclosed illustrating a system 300A that is capable of scanning a switch array 310 with a reduced number of digital signals, in accordance with one embodiment of the present invention. Specifically, the system 300A comprises a switch array 310, a plurality of I/O lines 320, and a plurality of pull down resistors (R1, R2, R3, and R4 of FIG. 3A). Although the present embodiment is described illustrating a 4*4 switch array accessed through 4 I/O lines, other embodiments of the present invention are well suited to an N*N switch array accessed through N I/O lines. Still other embodiments may comprise a subset of the N*N array of switches.

The switch array 310 is comprised of a plurality of switches. In one embodiment, the switch array 310 comprises a key matrix (e.g., a keyboard for inputting signals into a computer). The switches are activated to complete a circuit path through the switches.

In general, the switch array comprises a maximum of N(N−1) switches arranged in a matrix that is scanned using N I/O lines. This is due to the fact that the switches located on the diagonal are not assessed by the controller. The explanation is that N*N is the maximum number of switches, from which the diagonal line of N switches is subtracted. That is, N*N−N=N*(N−1). For example, in a switch array of 12 keys, only 4 I/O lines are needed; in a switch array of 20 keys, only 5 I/O lines are needed; and in a switch array of 132 keys, only 12 I/O lines are needed. As seen, the benefit increases with the number of keys in the switch array.

In exemplary system 300A, the maximum number N(N−1) switches are as follows: S12, S13, S14, S21, S23, S24, S31, S32, S34, S41, S42, and S43 of FIG. 3A.

In one embodiment, the matrix is an N*N matrix, or a square matrix, such as, the 4*4 matrix in FIG. 3A. In another embodiment, the rows and columns in the matrix are not equally represented, and as such, the matrix is an N*M matrix. In still another embodiment, the switches, in the matrix that is coupled to N I/O lines, comprise a number that is less than the maximum N(N−1) allowed, thus being a subset of the example shown.

The switch array is serviced or accessed and coupled to a plurality of N I/O lines. The plurality of N input/output (I/O) lines are used for transferring digital signals into and out of the matrix. The digital signals are used to scan the matrix to determine which of the plurality of switches is activated.

More particularly, N I/O lines access the switch array 310 such that the plurality of N I/O lines are coupled to the maximum of N(N−1) switches to create a plurality of circuit paths. In system 300A, the N I/O lines comprise 4 I/O lines, as follows: L1, L2, L3, and L4 of FIG. 3A. The circuit paths are completed by activating an associated switch. As such, each of circuit paths couple two of the plurality of N I/O lines through an associated switch.

The pull down resistors in system 300A (R1, R2, R3, and R4 of FIG. 3A) are used to pull the voltage to a logic level low in each of the I/O lines. In one embodiment, the pull down resistors in system 300A are passive resistors (e.g., a real physical component). In another embodiment, the pull down resistors in system 300A are active resistors, as previously described in relation to FIG. 2.

The I/O lines are driven high to identify a particular switch in the switching array 310. In general, the scanning sequence applied to the switch array of system 300A proceeds by sequentially configuring each of the plurality of N I/O lines to an output mode of operation as a source I/O line. Then, for each of the I/O lines, a logic level high signal is applied over the source I/O line and sent to the switch array 310. The scanning sequence is applied to the entire switch array in a period of time that ensures that any activation of a switch will complete a circuit path and become detected.

When one of the switches is activated, a positive logic high voltage is read on one of the I/O lines that is not the source I/O line. For example, when the source line is the L1 I/O line, the remaining I/O lines (L2, L3, and L4) are configured to an input mode of operation. As such, in the example, if S13 was activated, then the logic high level input signal over L1 I/O line would complete a path through S13 to the L3 I/O line.

The switch array 300A further comprises a plurality of diodes. In FIG. 3A, the plurality of diodes comprise diodes D1, D2, D3, and D4. In a switch array accessed by and coupled to N I/O lines, the plurality of diodes would comprise N diodes. The diodes are arranged to differentiate between pairs of switches that complete paths between pairs of the plurality of I/O lines when scanning the switch array 210.

Figure 3B:
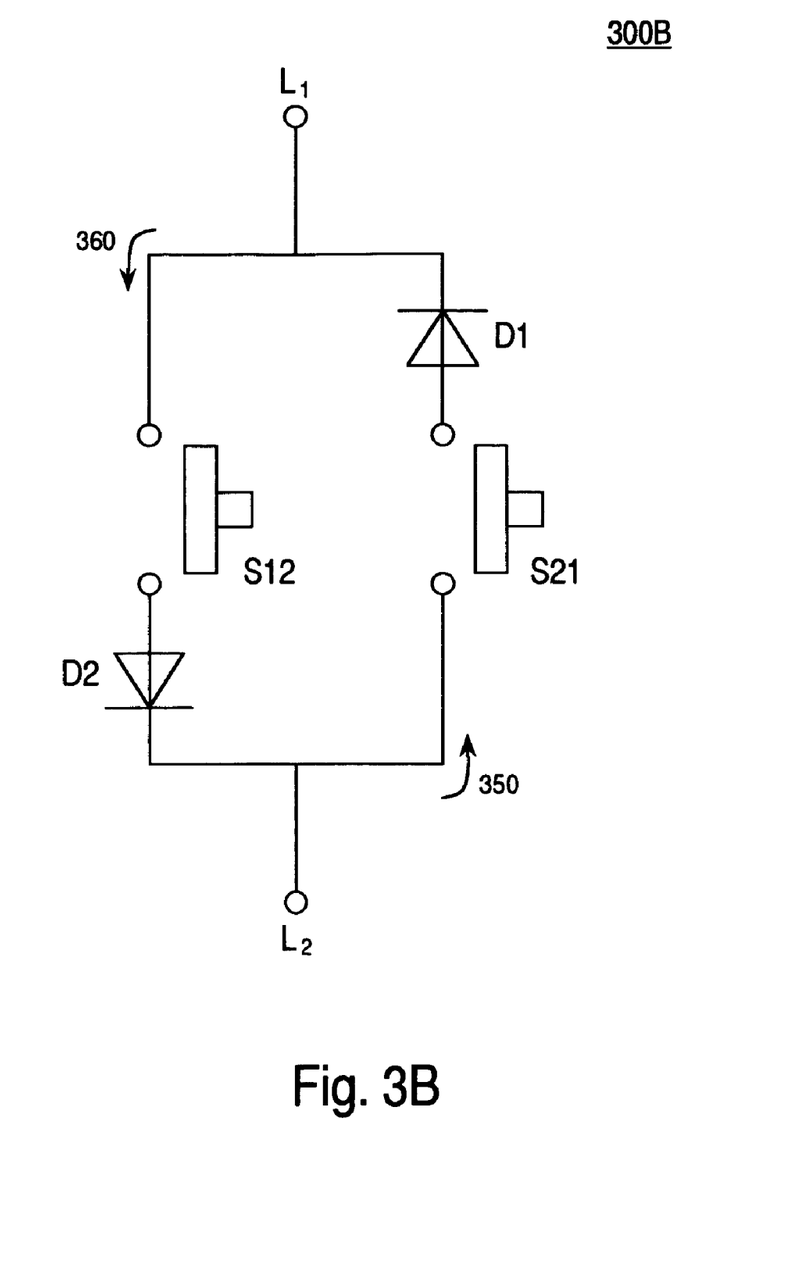
FIG. 3B is a schematic diagram of a circuit illustrating a pair of equivalent circuit paths between a pair of I/O lines, a pair of switches, and a pair of diodes for distinguishing between the pair of equivalent circuit paths, in accordance with one embodiment of the present invention.

For example, FIG. 3B is a schematic diagram of a system 300B used for distinguishing between two circuit paths in the switch array 310 of FIG. 3A. In system 300A, each pair of I/O lines can be coupled together through two separate circuit paths. For example, a high output signal sent over L1 can be read at L2 via S12. Similarly, a high output signal sent over L2 can be read at L1 via S21. Without the use of diodes, it would be impossible to determine which switch was activated.

FIG. 3B discloses a circuit 300B that includes a pair of diodes D1 and D2 that is capable of differentiating between pairs of switches that complete paths between pairs of the I/O lines when scanning an associated switch array (e.g., switch array 310). The circuit 300B is an equivalent circuit diagram between the L1 and L2 I/O lines of the switch array 310 of FIG. 3A. With the inclusion of diodes D1 and D2, the circuit path between a pair of circuit paths 350 and 360, as also shown in FIG. 3A, can be determined knowing the source I/O line and the input I/O line where the logic high input signal is read as an input.

More particularly, in a pair of I/O lines, that is coupled to a pair of switches, a signal is outputted into one of the pair of I/O lines. Because of the diodes, the signal is read at the other I/O line in the pair of I/O lines when a particular switch of the pair of switches is activated, but not when the other is activated. That is, the pair of diodes coupled to the pair of I/O lines help differentiate which of the pair of switches is activated when reading the signal.

For example, the circuit path 360, in FIGS. 3A and 3B, takes an output signal from L1 I/O line, and when the switch S12 is activated sends the output signal through diode D2 and out to the L2 I/O line as an input. Because of the diode D1, no current can flow through S21 when activated. As such, only one circuit path can be completed when the source line is L1 I/O line and the input line is L2 I/O line.

Conversely, the circuit path 350 takes an output signal from L2 I/O line and when the switch S21 is activated, sends the output signal through the diode D1 and out to the L1 I/O line as an input. Because of the diode D2, no current can flow through S12 when activated. As such, only one circuit path is present when the source line is L2 I/O line and the input line is the L1 I/O line.

Table 1 illustrates the increase of usable keys or alternately the reduction of pins necessary to support a switch array using embodiments of the present invention when compared to the conventional system that require N+N pins to support an N*N matrix. Table 1 illustrates the comparison of a conventional (legacy system) with a system not using diodes, and to the systems with diodes, for example, the system 200 shown in FIG. 2 and system 300A shown in FIG. 3A, respectively.

TABLE 1

| Number of Keys Number of Signals 2N | Legacy Scheme N*N | Cross Scheme (No Diodes) N* (2N − 1) | Diode Scheme 2N* (2N − 1) |
|---|---|---|---|
| 2 | 1 | 1 | 2 |
| 4 | 4 | 6 | 12 |
| 6 | 9 | 15 | 30 |

TABLE 1-continued

| Number of Keys Number of Signals 2N | Legacy Scheme N*N | Cross Scheme (No Diodes) N* (2N − 1) | Diode Scheme 2N* (2N − 1) |
|---|---|---|---|
| 8 | 16 | 28 | 56 |
| 10 | 25 | 45 | 90 |
| 12 | 36 | 66 | 132 |
| 14 | 49 | 91 | 182 |
| 16 | 64 | 120 | 240 |
| 18 | 81 | 153 | 306 |
| 20 | 100 | 190 | 380 |
| 22 | 121 | 231 | 462 |
| 24 | 144 | 276 | 552 |
| 26 | 169 | 325 | 650 |
| 28 | 196 | 378 | 756 |
| 30 | 225 | 435 | 870 |
| 32 | 256 | 496 | 992 |

As shown in Table 1, the benefits received using the cross scheme and the diode scheme over the legacy scheme are an increased number of keys supported with the same number of pins or signals. For example, in an 8 pin port system, the legacy system can support 16 keys, the cross scheme can support 28 keys, and the diode scheme can support 56 keys. This means an additional 12 keys in the cross scheme case, or an additional 40 keys in the diode scheme case. In similar fashion, for a device with a key interface of 120 keys, there will be needed 22 pins in the legacy scheme, 16 pins in the cross scheme, and a minimum number of 12 pins in the diode scheme case. As seen, embodiments of the present invention reduce the number of pins needed to support a key matrix.

Figure 4:
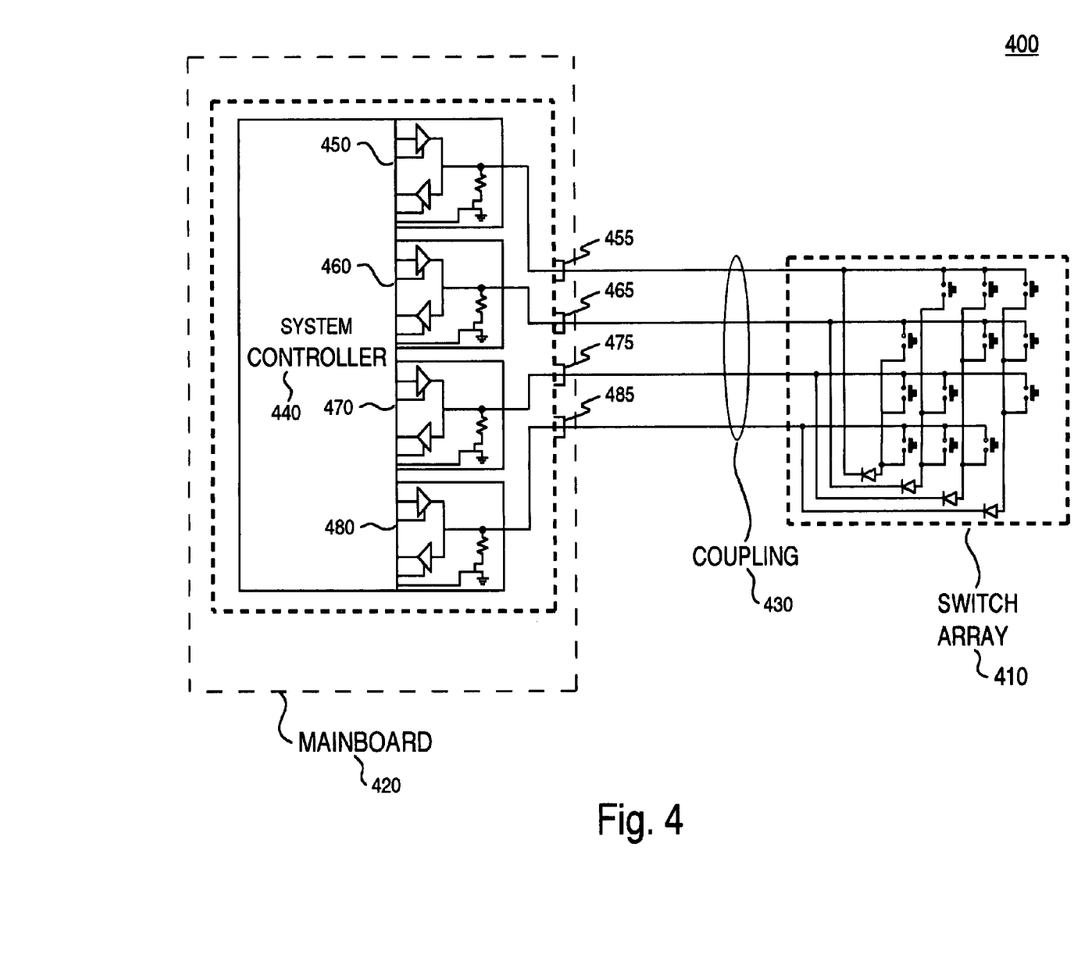
FIG. 4 is a schematic diagram of a system that is capable of scanning an N*N matrix comprising N(N–1) switches using N I/O lines, in accordance with one embodiment of the present invention.

FIG. 4 is a schematic diagram of a system 400 that is capable of scanning a switch array 410, in accordance with one embodiment of the present invention. The switch array 410 is similar to the switch array 210 of FIG. 2, in one embodiment. The switch array comprises a maximum of N(N−1) switches. A plurality of N I/O lines access and transfer signals to the switch array 410 over coupling means 430. In one embodiment, the coupling means 430 is wiring, especially when the switch array 410 is separate from the system controller 440. For example, wiring means 430 is a ribbon cable, in one embodiment.

In the system 400 of FIG. 4, a mainboard 420 comprises a system controller 440, a plurality of I/O drivers (450, 460, 470, and 480), and pins 455, 465, 475, and 485. The system controller 440 is used for scanning the switch array 410. The system controller 440 scans by sending a logic high signal to the switch array 410 from one of said plurality of I/O lines. When an appropriate switch is activated, the logic high signal is read at another of the plurality of I/O lines, as previously described. The system controller scans through each of the input mechanisms in the switch array 410 by sequentially sending the logic high signal from each of the I/O lines in the cable 430. In that way, all of the switches are scanned.

In general, when a switch is activated, a circuit path is completed between two I/O lines for a logic high signal to return to the system controller 440, as described previously. For example, a logic high signal sent over a source I/O line is detected and read at another of the plurality of I/O lines when an associated switch is activated. In that way, understanding which I/O line is the source element, and which I/O line receives the input logic high level determines which of the switches is activated.

In system 400, the system controller controls the pins associated with the mainboard via the I/O drivers. For example, the system controller through I/O driver 450 controls pin 455, through I/O driver 460 controls pin 465, through I/O driver 470 controls pin 475, and through I/O driver 480 controls pin 485.

More particularly, a logic high signal is applied sequentially to each of the pins 455, 465, 475, and 485. When one pin is driven high, all the remaining pins are pulled to a logic low through pull down resistors, as described previously. The pull down resistors are enabled by a system controller, in one embodiment, as will be described more fully in FIG. 5 below.

System 400 illustrates the internal circuitry of an electronic system configured to receive inputs, in accordance with one embodiment of the present invention. For example, the electronic system comprises a box providing electronic services, such as, a digital video disk (DVD) player. Information is communicated to the electronic system through a keyboard, a touchpad, or some other communication means. The electronic system is comprised of a switch array configured in a matrix that supports a maximum of N*(N−1) switching elements. In addition, the electronic system comprises a plurality of N input/output (I/O) lines coupled to the switch array for delivering digital signals through the electronic system to scan the matrix. Further, a plurality of N passive devices is configured to differentiate between pairs of the N(N−1) switching elements that complete similar circuit paths between pairs of I/O lines.

Also, a system controller 440 is coupled to the plurality of N I/O lines for scanning the matrix. This is accomplished by sending digital signals to the matrix from the N I/O lines and detecting the digital signals at the N I/O lines. The switch array is configured so that between any pair of I/O lines there is a pair of circuit paths. Each circuit path is completed through a switching element, and a passive device, which is used to differentiate between the pair of circuit paths.

In one embodiment, the passive devices in FIG. 4 comprise diodes, as described previously. In other embodiments of the present invention, the passive devices can comprise other circuit elements like resistors, capacitors, etc.

Figure 5:
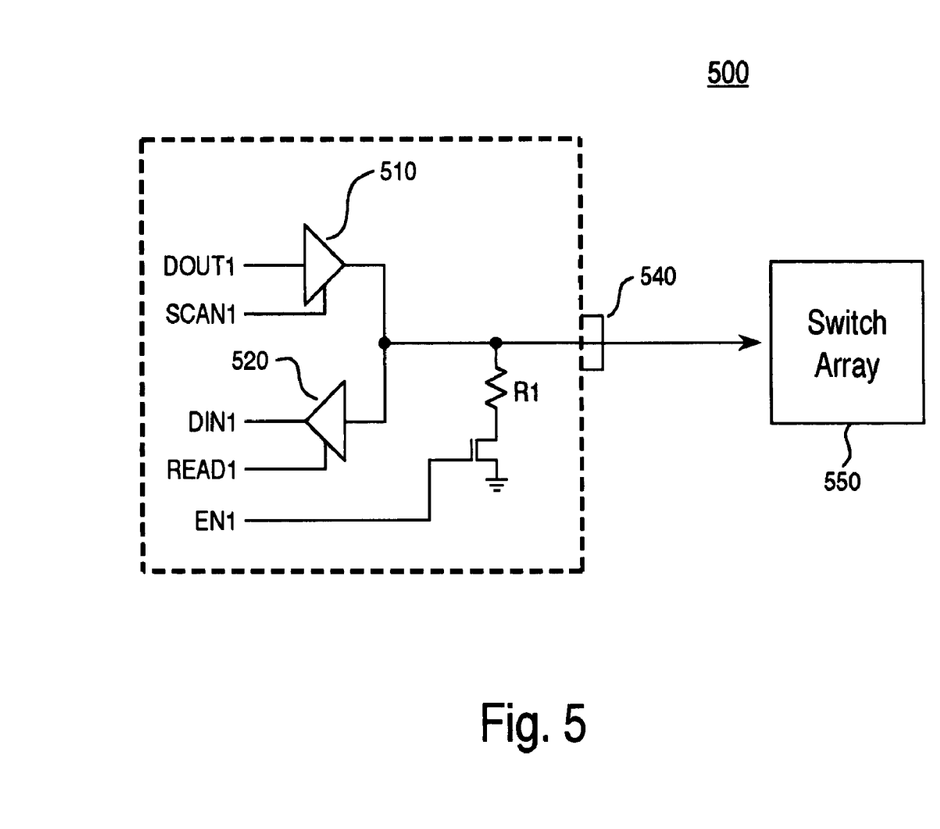
FIG. 5 is a schematic diagram of an I/O driver used for scanning a matrix of switches, in accordance with one embodiment of the present invention.

FIG. 5 is a schematic diagram of an exemplary I/O interface circuit 500, such as, I/O drivers 450, 460, 470, and 480. The I/O interface circuit 500 comprises a output stage driver 510, an input stage receiver 520, and a pulldown resistor R1. The I/O interface circuit 500 controls pin 540.

In the output mode of operation, the I/O interface circuit 500 enables the output stage driver 510 through the SCAN1 signal. In this way, an output logic high signal is sent to the switch array 550 over an I/O line. Simultaneously, the I/O interface circuit 500 disables the input stage driver 520 through the READ1 lead. In this way, an output signal based on the DOUT1 signal is outputted from the pin 540 and sent to the switch array 550.

In one embodiment, during the output mode of operation, the pulldown resistor is disengaged using the enable signal EN1. In this way, power is reduced since the pin is driven without having to overcome a resistive load.

In the input mode of operation, the I/O interface circuit 500 enables the input stage driver 520 through the READ1 lead. In this way, any input logic high signal that is inputted to pin 540 over an associated I/O line from the switch array is read. Simultaneously, the I/O interface circuit 500 disables the output stage driver 510 through the SCAN1 lead. In this way, an input signal from the switch array through pin 540 is read at the DIN1 lead.

The output stage driver 510 can be driven high or low, and also placed in a high impedance mode (tri-state) mode. In one embodiment, the output driver is required to drive only two states, logic high or the tri-state. The third state, logic low, is unnecessary.

Figure 6:
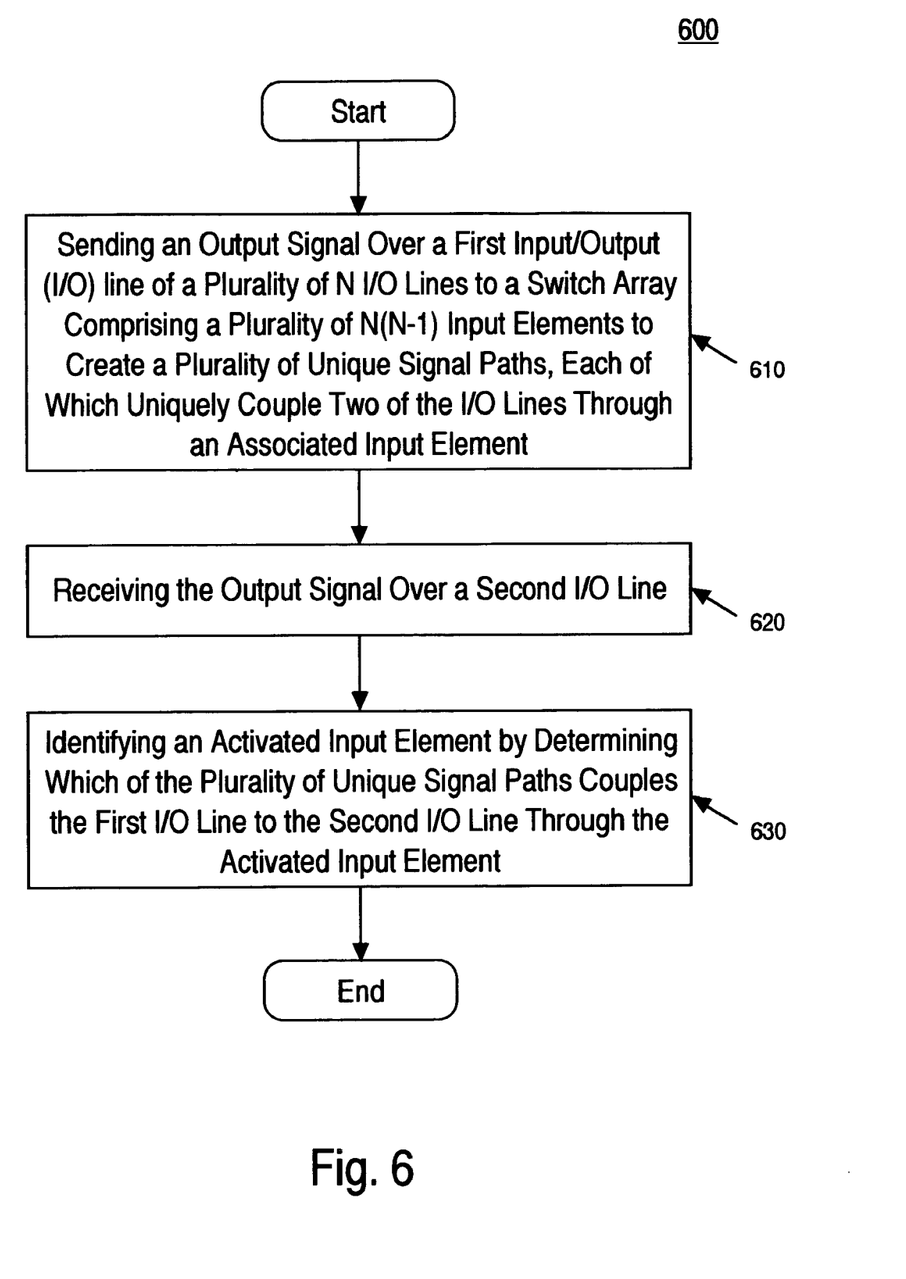
FIG. 6 is a flow chart illustrating steps in a computer-implemented method for scanning a switch array, in accordance with one embodiment of the present invention.

Now referring to FIG. 6, a flow chart 600 is disclosed illustrating steps in a method for scanning a switch array, using a reduced number of digital signals, in accordance with one embodiment of the present invention. The method, as implemented, is capable of scanning a switch array using a reduced number of signals as compared with a conventional switch array. In general, using N number of I/O lines, the present embodiment can read a number of up to N*(N−1) switches as compared to (¼)*N*N allowed by a legacy system.

The present embodiment begins at step 610 by sending an output signal over a first I/O line of a plurality of N I/O lines to a switch array comprising a plurality of N*(N−1) switches. The first I/O line is configured to operate in an output mode of operation while all the other lines are configured in an input mode of operation.

The switches are arranged in an N*N matrix, in one embodiment. The N*N matrix is configured so that between any pair of I/O lines, a pair of circuit paths are completed through one of two possible switches.

The remaining I/O lines in the plurality of I/O lines are configured to receive signals in an input mode of operation. As such, each of these lines are pulled low to digitally distinguish which line of them is driven high by the output signal.

The output signal is sent sequentially over the N I/O lines to scan the matrix. In this way, in one or more cycles, a plurality of output signals are sent over the plurality of N I/O lines to scan the matrix of a maximum N(N−1) switches.

The plurality of N I/O lines are coupled to the N(N−1) switches in such a way to create a plurality of unique signal paths. Each of the signal paths uniquely couple two of the I/O lines through an associated switch.

At 620, the present embodiment receives the signal over a second I/O line. The second I/O line is separate from the first I/O line and is configured in an input mode of operation to receive and read the signal (e.g., a logic high signal).

At 630, the present embodiment continues by isolating an activated switch by determining which of the plurality of unique signal paths couples the first I/O line to the second I/O line through the activated switch. As previously described, when the first I/O line is known to be a source I/O line and the second I/O line is known to be receiving a signal in an input mode of operation, then an associated switch can be determined.

In one embodiment, the method outlined in flow chart 600 is performed on all the I/O lines in the matrix in a sequential manner. That is, all the I/O lines in the matrix are scanned sequentially. Thereafter, the process in flow chart 600 repeats, such that, the I/O lines are scanned continuously.

Accordingly, various embodiments of the present invention disclose a system and method for a key matrix that can be scanned using a reduced number of digital signals. As an advantage over the prior art, the present invention is capable of reducing the number of pins on a system controller used to scan a key matrix to reduce manufacturing costs. As a further advantage, the present invention is capable of reducing the number of wires used to communicate signals between a system controller and a key matrix, thereby reducing the size and cost of cabling and ultimately reducing the manufacturing costs. Moreover, the present invention is capable of increasing the functionality and number of services provided on an integrated circuit (IC) chip, without increasing the number of pins on the IC chip used to access those services.

While the method of the embodiment illustrated in flow chart 600 shows specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a system and method for a switch array that is capable of being scanned using a reduced number of digital signals is described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. A data-input array comprising:
    a maximum of N*(N−1) input elements arranged in a matrix;
    a plurality of N input/output (I/O) lines for transferring signals used to scan said matrix to determine which of said input elements is activated, wherein said plurality of N I/O lines are coupled to said input elements to create a plurality of signal paths, each of which couple two of said plurality of N I/O lines through an associated input element; and
    a plurality of diodes arranged to differentiate between pairs of input elements that complete paths between same pairs of said plurality of I/O lines when scanning said matrix.

2. The data-input array of claim 1, wherein at least one of said plurality of input elements comprises a switch.

3. The data-input array of claim 1, further comprising:
    a plurality of pull down resistors for pulling said plurality of N I/O lines to a logic low level.

4. The data-input array of claim 1, further comprising:
    a plurality of pull up resistors for pulling said plurality of N I/O lines to a logic high level.

5. The data-input array of claim 4, wherein at least one of said plurality of pull up resistors comprises an active pull up resistor.

6. The data-input array of claim 4, wherein at least one of said plurality of pull up resistors comprises a passive pull up resistor.

7. The data-input array of claim 1, further comprising:
    a system controller for scanning said matrix by sending a signal to said matrix from one of said plurality of N I/O lines and reading said signal at another of said plurality of N I/O lines when an activated input element completes a circuit path for said signal to return to said system controller.

8. The data-input array of claim 1, wherein said maximum of N*(N−1) input elements comprise a pair of input elements; and
wherein said plurality of N I/O lines comprise a pair of I/O lines coupled to said pair of input elements for inputting a signal into one of said pair of I/O lines and for reading said signal at another of said pair of I/O lines when one of said pair of input elements is activated; and
wherein said plurality of diodes comprise a pair of diodes coupled to said pair of I/O lines for differentiating which of said pair of input elements is activated when reading said signal at said another of said pair of I/O lines.

9. The data-input array of claim 1, wherein said data-input array comprises an N*N matrix that is configured to support said maximum of N*(N−1) input elements.

10. The data-input array of claim 1, wherein at least one of said plurality of N I/O lines is bi-directional, such that an associated signal comprises an input signal or an output signal.

11. The data-input array of claim 1, wherein said data-input array is configured so that between any pair of I/O lines two circuit paths exist, each defining a unique switch and a unique diode device, wherein said unique diode device differentiates between said two circuit paths.

12. The data-input array of claim 1, wherein said signals comprise digital signals.

13. The data-input array of claim 1, wherein said signals comprise analog signals.

14. An electronic system configured to receive inputs, comprising:
a switch array comprising a maximum of N(N−1) switches;
a plurality of N input/output (I/O) lines coupled to said switch array for delivering digital signals through said system to scan said switch array;
a plurality of N diode devices configured to differentiate between pairs of said switches that complete similar circuit paths between pairs of I/O lines; and
a system controller coupled to said plurality of N I/O lines for scanning said switch array by sending said digital signals to said switch array from said N I/O lines and detecting said digital signals at said N I/O lines, wherein said switch array is configured so that between any pair of I/O lines two circuit paths exist, each defining a unique switch and diode device combination so that said system controller can differentiate between said two circuit paths.

15. The system of claim 14, wherein said data-input array comprises an N*N matrix that is configured to support said maximum of N*(N−1) switches.

16. The system of claim 14, wherein said data-input array comprises a keypad.

17. The system of claim 14, wherein said data-input array comprises a touchpad.

18. The system of claim 14, wherein each of said digital signals comprise a logic high digital signal.

19. A method for scanning a switch array comprising:
a) sending a signal over a first I/O line of a plurality of N input/output (I/O) lines to a switch array comprising a maximum of N(N−1) input elements, wherein said plurality of N I/O lines are coupled to said input elements to create a plurality of unique signal paths, each of which uniquely couple two of said I/O lines through an associated input element and an associated diode device;
b) receiving said signal over a second I/O line;
c) identifying an activated input element by determining which of said plurality of unique signal paths couples said first I/O line to said second I/O line through said activated input element.

20. The method of claim 19, further comprising:
sequentially sending a plurality of output signals over said plurality of N I/O lines to scan said switch array.

21. The method of claim 19, further comprising:
pulling each of said plurality of I/O lines to a logic low level to digitally distinguish those of said plurality of I/O lines driven to a logic high level by said signal.

22. The method of claim 19, further comprising:
configuring said switch array so that between any pair of I/O lines two circuit paths exist, each defining a unique switch and diode device combination to differentiate between said two circuit paths.

23. The method of claim 19, wherein each of said maximum of N*(N−1) input element comprises a switch.

24. The method of claim 19, wherein said switch array comprises a key matrix.

25. The method of claim 19, wherein said switch array comprises an N*N matrix configured to support said maximum of N*(N−1) input elements.

26. The method of claim 19, wherein said signal comprises a logic high signal.

* * * * *